(12) United States Patent
Lai et al.

(10) Patent No.: US 7,447,028 B2
(45) Date of Patent: Nov. 4, 2008

(54) HEAT DISSIPATION DEVICE

(75) Inventors: Cheng-Tien Lai, Tu-Cheng (TW); Tao Li, Shenzhen (CN); Wei-Qiang Tian, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 76 days.

(21) Appl. No.: 11/309,849

(22) Filed: Oct. 12, 2006

(65) Prior Publication Data
US 2008/0062641 A1 Mar. 13, 2008

(30) Foreign Application Priority Data
Sep. 8, 2006 (CN) ............ 2006 1 0062526

(51) Int. Cl.
H05K 7/20 (2006.01)
(52) U.S. Cl. .............. 361/697; 361/690; 361/695; 174/16.3; 165/80.3; 165/104.33
(58) Field of Classification Search ............ None
See application file for complete search history.

(56) References Cited
U.S. PATENT DOCUMENTS

| 5,494,098 | A | 2/1996 | Morosas | |
|---|---|---|---|---|
| 6,304,445 | B1 * | 10/2001 | Bollesen | 361/697 |
| 6,717,814 | B2 * | 4/2004 | Li | 361/704 |
| 6,736,196 | B2 * | 5/2004 | Lai et al. | 165/122 |
| 6,940,716 | B1 * | 9/2005 | Korinsky et al. | 361/695 |
| 7,040,384 | B2 * | 5/2006 | Shiang-Chich | 165/122 |
| 7,204,750 | B2 * | 4/2007 | Shen et al. | 454/184 |
| 7,228,889 | B1 * | 6/2007 | Tian et al. | 165/122 |
| 7,251,136 | B2 * | 7/2007 | Yang et al. | 361/695 |
| 7,256,997 | B2 * | 8/2007 | Chen et al. | 361/697 |
| 7,304,845 | B2 * | 12/2007 | Xia et al. | 361/697 |
| 2007/0035926 | A1 * | 2/2007 | Xia et al. | 361/695 |
| 2007/0058341 | A1 * | 3/2007 | Hsiao | 361/695 |
| 2007/0274038 | A1 * | 11/2007 | Sun | 361/695 |

FOREIGN PATENT DOCUMENTS

| TW | 415603 | 12/2000 |
|---|---|---|
| TW | 511872 | 11/2002 |

* cited by examiner

Primary Examiner—Boris L Chervinsky
(74) Attorney, Agent, or Firm—Frank R. Niranjan

(57) ABSTRACT

A heat dissipation device includes a heat sink, a fan producing an airflow flowing towards the heat sink, an air-guiding member positioned between the fan and the heat sink and a cover enclosing the fan and the heat sink. The air-guiding member includes an air deflector dividing the airflow produced by the fan into two airstreams. The air deflector guides the airstreams of the airflow flowing towards different portions of the heat sink. By the air deflector, the portion of the heat sink, which is hotter than the other portion of the heat sink, has more air flowing therethrough.

17 Claims, 7 Drawing Sheets

US 7,447,028 B2

HEAT DISSIPATION DEVICE

FIELD OF THE INVENTION

The present invention relates generally to a heat dissipation device, and more particularly to a heat dissipation device incorporating with a fan and air-guiding members for dissipating heat generated by an electronic device.

DESCRIPTION OF RELATED ART

It is well known that, during operation of a computer, electronic devices such as central processing units (CPUs) frequently generate large amounts of heat. The heat must be quickly removed from the electronic device to prevent it from becoming unstable or being damaged. Typically, a heat dissipation device is attached to an outer surface of the electronic device to absorb heat from the electronic device. The heat absorbed by the heat dissipation device is then dissipated to ambient air.

Referring to FIG. 7, a heat dissipation device in accordance with related art includes a heat sink 30 and a fan 40 mounted on a lateral side of the heat sink 30, for enhancing the heat dissipation efficiency of the heat sink 30. The heat sink 30 includes a base 32 and a plurality of fins 34 vertically extending from a top face of the base 32. In use, a bottom surface of the base 32 is attached to an electronic device to absorb heat generated by the electronic device; then, the heat reaches the fins 34, and is dissipated to the ambient air under the help of an airflow produced by the fan 40. As well known, the temperature distribution of each fin 34 is generally decreased from the base 32 towards a free end of each fin 34. In other words, lower parts of the fins 34, which are more closer to the base 32, have higher temperatures than those of upper parts of the fins 34, which are more away from the base 32. Therefore, the lower parts of the fins 34 need more airflow than the upper parts of the fins 34 so that the heat can be quickly dissipated.

However, the airflow produced by the fan 40 in accordance with the related art is uniformly distributed over the heat sink 40; that is, the lower parts and the upper parts of the fins 34 have substantially equal amount of airflow flowing therethrough. Therefore, the heat dissipation device in accordance with related art dose not make good use of the airflow of the fan 40. It is therefore desirable to increase the efficiency of the heat dissipation device by sufficient use of the airflow produced by the fan 40.

SUMMARY OF THE INVENTION

A heat dissipation device comprises a heat sink, a fan producing an airflow flowing towards the heat sink, an air-guiding member positioned between the fan and the heat sink, and a cover enclosing the fan and the heat sink. The air-guiding member comprises an air deflector dividing the airflow produced by the fan into two airstreams. The air deflector guides the airstreams of the airflow flowing towards different portions of the heat sink, wherein the portion of the heat sink, which is hotter than the other portion of the heat sink, has more air flowing therethrough.

Other advantages and novel features will become more apparent from the following detailed description of preferred embodiments when taken in conjunction with the accompanying drawings, in which:

BRIEF DESCRIPTION OF THE DRAWINGS

Many aspects of the clip for heat sink can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
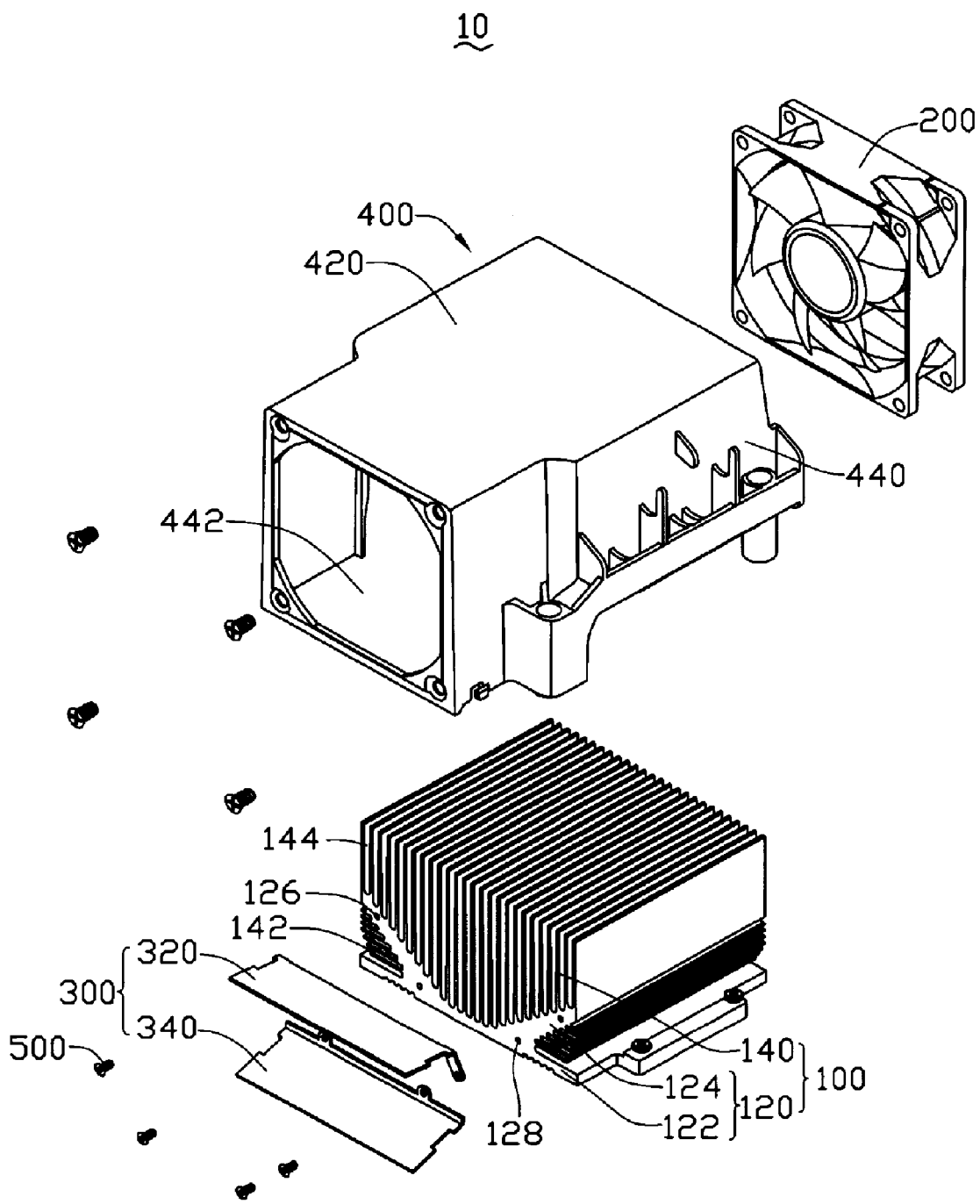
FIG. 1 is an exploded view of a heat dissipation device in accordance with a preferred embodiment of the present invention.
Figure 2:
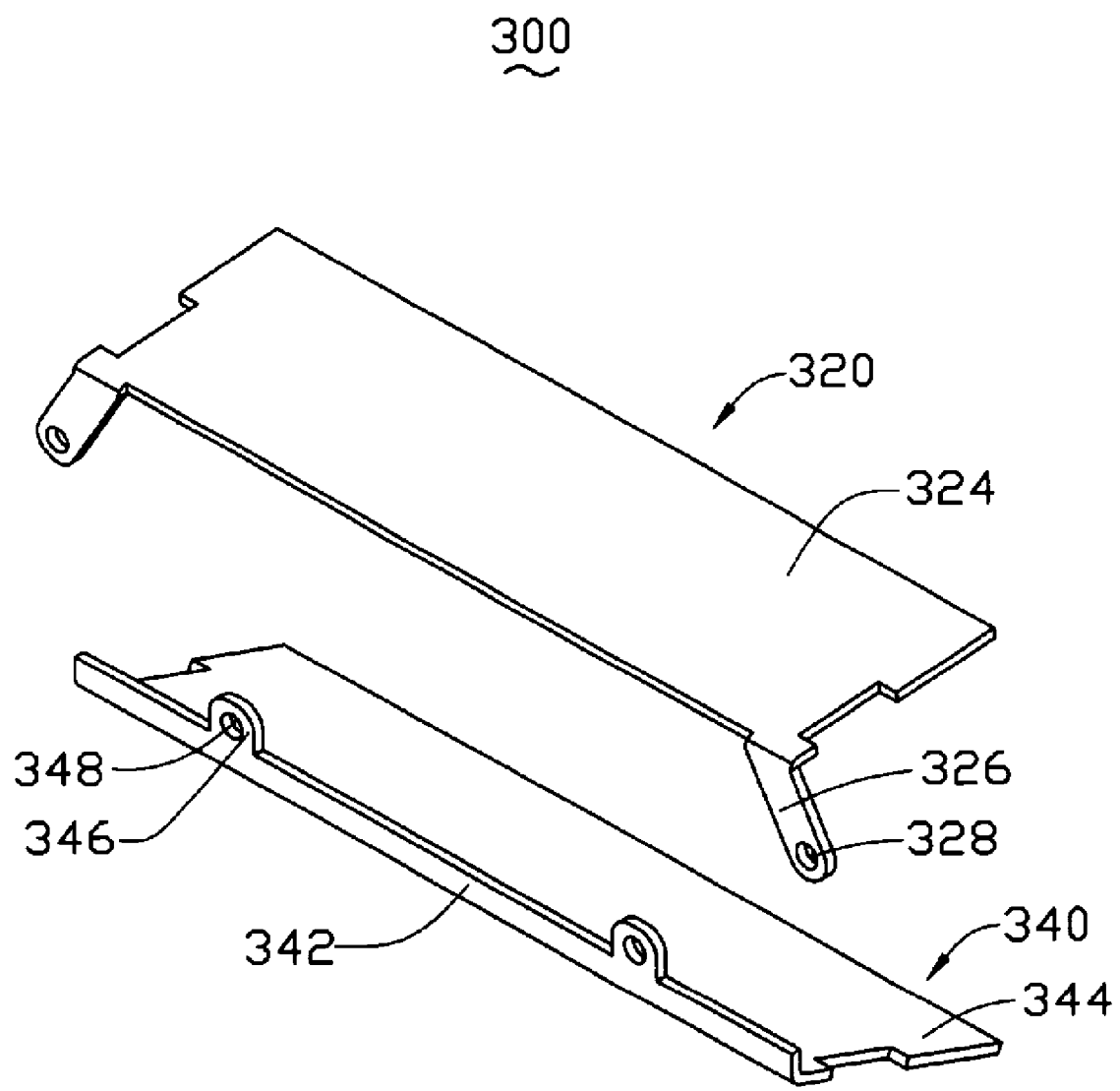
FIG. 2 is an enlarged view of an air-guiding member in FIG. 1, consisting of two air deflectors and viewed from another aspect.
Figure 3:
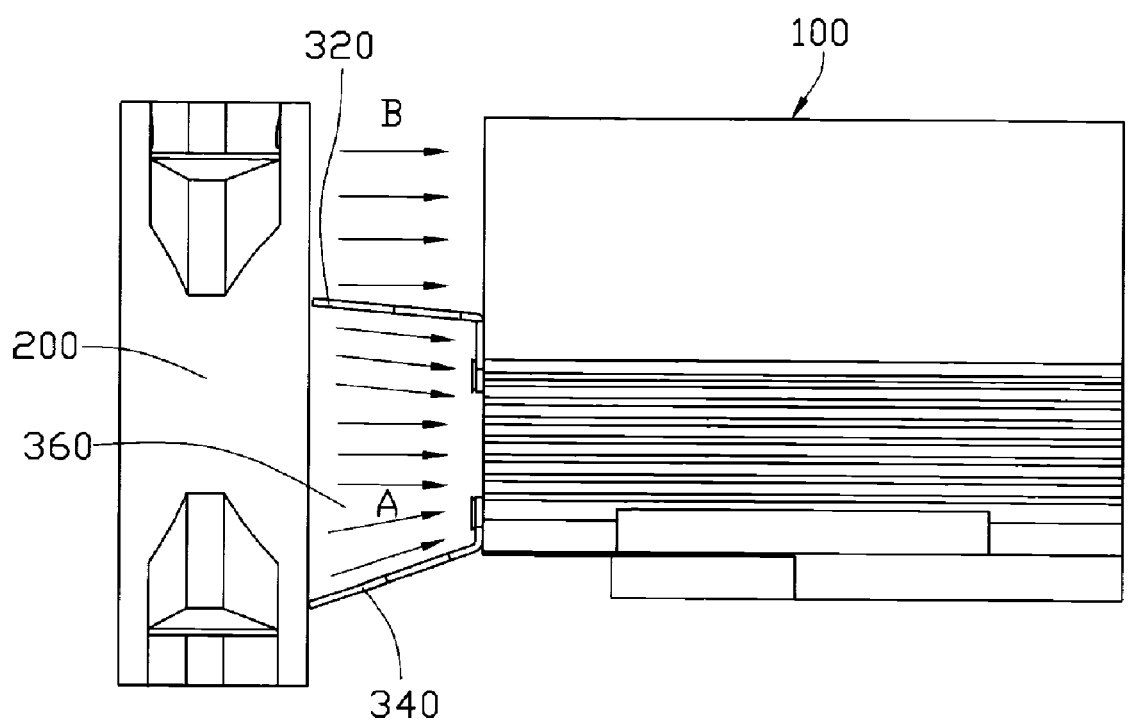
FIG. 3 is a side-elevational, partly assembled view of the heat dissipation device in FIG. 1.

Referring to FIGS. 1-3, a heat dissipation device 10 in accordance with a preferred embodiment of the present invention is illustrated. The heat dissipation device 10 comprises a heat sink 100, a fan 200, and an air-guiding member 300.

The heat sink 100 is integrally extruded from a metal block, such as an aluminum block, and comprises a heat conducting portion 120 and a plurality of fins 140 extending from the heat conducting portion 120. The heat conducting portion 120 comprises a base 122 having a bottom face for contacting a heat-generating electronic device such as a central processing unit (CPU), and two wings 124 extending upwardly and outwardly from a central portion of the base 122 to two opposite lateral side portions of the heat sink 100.

The two wings 124 divide the fins 140 into three fin units: two first fin units (not labeled) located between the wings 124 and the base 122 and a second fin unit (not labeled) located between the two wings 124. The two first fin units comprise a plurality of parallel first fins 142 extending horizontally and outwardly from the wings 124 and parallel to the base 122. The second fin unit comprises a plurality of parallel second fins 144 extending upwardly from the two wings 124. The second fins 144 are perpendicular to the first fins 142 of the first fin units.

At a front face of the heat sink 100, two threaded holes 126 are respectively defined in top portions of the two wings 124 at a same level, and two threaded holes 128 are respectively defined in bottom portions of the two wings 124 at a same level. The threaded holes 126, 128 are provided for securing the air-guiding member 300 to the heat sink 100.

The air-guiding member 300 comprises a first air deflector 320 and a second air deflector 340 sandwiched between the fan 200 and the heat sink 100.

The first air deflector 320 comprises a plate 324 slantways positioned between the heat sink 100 and the fan 200, and two arms 326 extending downwardly and outwardly from two opposite ends of the plate 324. Each arm 326 defines a through hole 328 at an lower end thereof, corresponding to the threaded holes 126 in top portions of the two wings 124. The first air deflector 320 is secured to the heat sink 100 via two screws 500 extending through the through holes 328 of the first air deflector 320 to engage with the threaded holes 126 in the heat sink 100.

The second air deflector 340 resembles the first air deflector 320. The second air deflector 340 comprises a flange 342 abutting against the front face of the heat sink 100, and a plate 344 extending downwardly and outwardly from the flange 342. The flange 342 of the second air deflector 340 comprises two arms 346 extending upwardly towards the first air deflector 320. Each arm 346 defines a through hole 348 therein, wherein the two through holes 348 are correspondent to the threaded holes 128 in the bottom portions of the two wings 124.

After the second air deflector 340 is secured to the heat sink 100 via two screws 500, free ends of the first and second air deflectors 320, 340 abut against the fan 200, and cooperatively define an inlet therebetween, which has an area smaller than the that of the fan 200. At the same time, fixed ends of the first and second air deflectors 320, 340 are spaced from each other, and cooperatively define an outlet therebetween, which covers a lower portion of the front face of the heat sink 100 and has an area smaller than that of the inlet. Therefore, the first and second air deflectors 320, 340 cooperatively define a first fan duct 360, which has a gradually decreased cross-sectional area from the fan 200 to the heat sink 100.

In this embodiment, the plates 324, 344 of the first and second air deflectors 320, 340 extend towards each other from the fan 200 to the heat sink 100, to thereby form the first fan duct 360 having a gradually decreased cross-sectional area. However, in another embodiment, the two plates 324, 344 of the two air deflectors 320, 340 may be so arranged that the first fan duct 360 has a gradually increased cross-sectional area from the fan 200 toward the heat sink 100.

During operation, the fan 200 produces an airflow laterally flowing towards the heat sink 100. Most of the airflow produced by the fan 200 flows into the inlet of the first fan duct 360 as indicated by arrows A in FIG. 3, and is then guided to flow into the lower portion of the heat sink 100. This serves to accelerate the heat dissipation of the lower portion of the heat sink 100, which is adjacent to the CPU and has a higher temperature. At the same time, a small quantity of the airflow produced by the fan 200 as indicated by arrows B in FIG. 3 flows past an upper portion of the heat sink 100, which has a relative lower temperature and need relative little airflow flowing therethrough to dissipate the heat.

As described above, the airflow produced by the fan 200 is distributed over the heat sink 100 according to the temperature distribution over the heat sink 100 via the first and second air deflectors 320, 340. In other words, the higher temperature the part of the heat sink 100 has, the larger portion the airflow will flow therethrough. This serves to make good use of the airflow produced by the fan 200 to dissipate the heat, and the efficiency of the heat dissipation device 10 is increased by sufficient use of the airflow produced by the fan 200.

Figure 4:
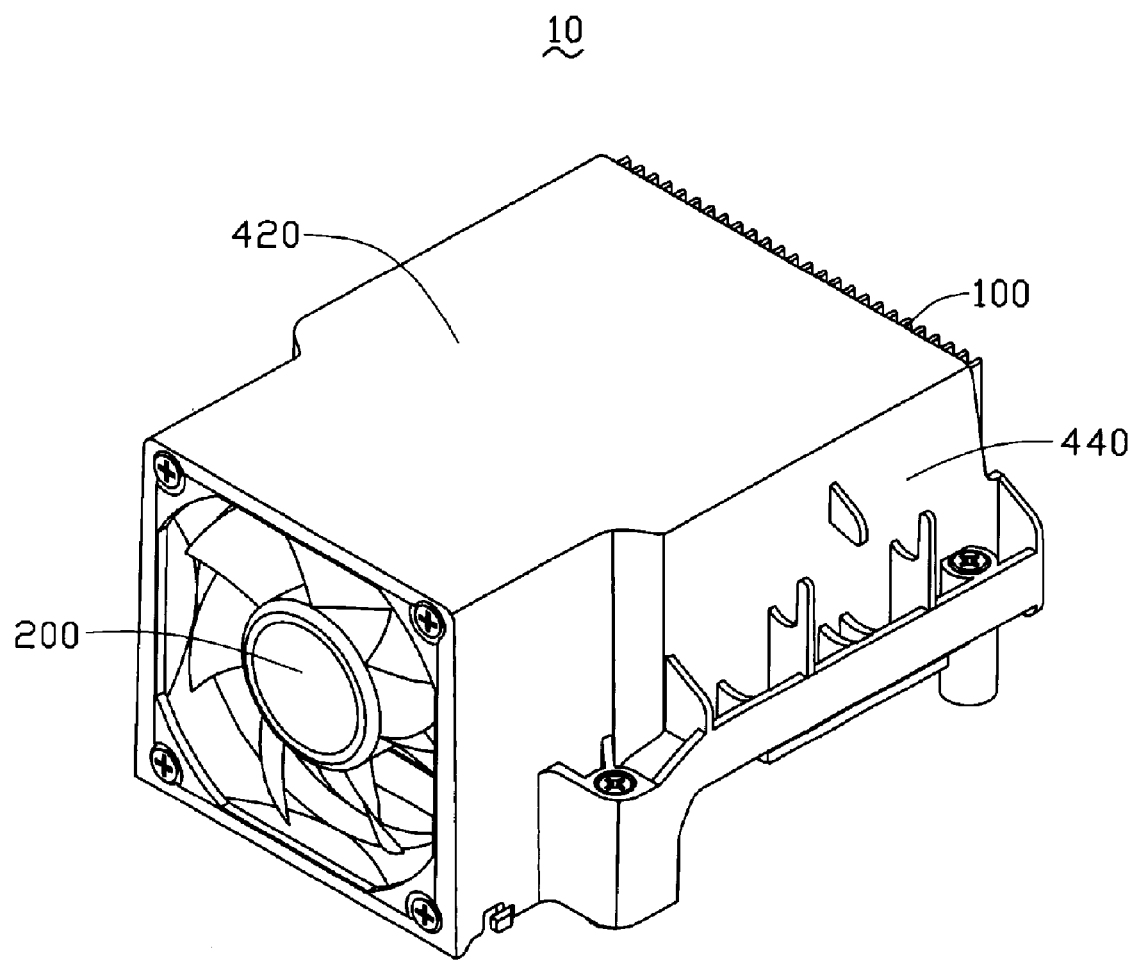
FIG. 4 is an assembled view of the heat dissipation device in FIG. 1.
Figure 5:
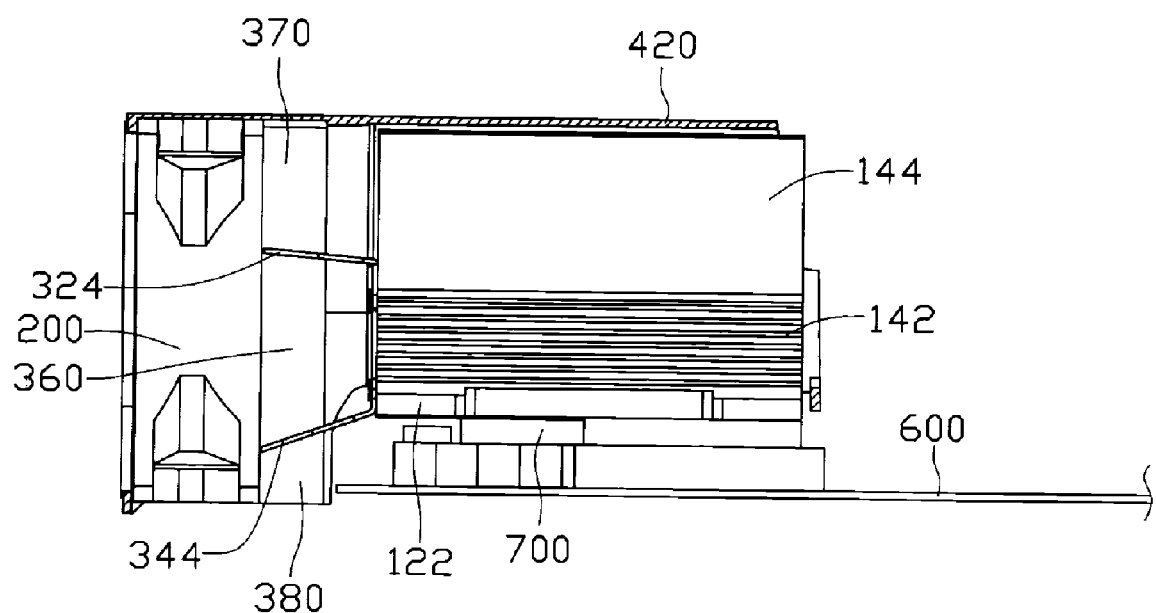
FIG. 5 is a side-elevational view of the heat dissipation device in FIG. 4 together with an electronic component mounted on a printed circuit board, wherein a part of a cover of the heat dissipation device is cut away to clearly show an inner structure of the heat dissipation device.

Please also referring to FIGS. 4-5, for further increasing the efficiency of the heat dissipation device 10, a cover 400 is provided to enclose the fan 200 and the heat sink 100 with the air-guiding member 300. The cover 400 has a top wall 420 spaced from the base 122 of the heat sink 100, and three sidewalls 440 respectively extending perpendicularly downwards from three sides of the top wall 420. The two lateral sidewalls 440 of the cover 400 are arranged to enclose a pair of lateral side portions of the heat sink 100, and the front sidewall 440 defines an opening 442 therein aligned with the fan 200. In the illustrated embodiment, the cover 400 is made of aluminum but alternatively it could be made of steel, copper or any other suitable material, such as plastic.

The cover 400 can be divided into two rooms (not labeled), namely a first room receiving the heat sink 100 therein, and a second room communicating with the first room and being adjacent to the front sidewall 440 of the cover 400. The second room is smaller than the first room for receiving the fan 200 therein. The fan 200 is mounted to the front sidewall 440 of the cover 400 by means of screws (not labeled).

After the cover 400 is mounted to the heat sink 100 and the fan 200, the cover 400 encloses the heat sink 100 and the fan 200 therein, and serves as a fan duct so as to guide the airflow produced by the fan 200 to flow towards the heat sink 100. Moreover, the first and second air deflectors 320, 340 of the air-guiding member 300 further divide the fan duct defined by the cover 400 into three smaller fan ducts, namely the first fan duct 360 between the first and second air deflectors 320, 340, a second fan duct 370 located above the first fan duct 360, and a third fan duct 380 located below the first fan duct 360. In this embodiment, the third fan duct 380 is defined by a printed circuit board 600 (particularly shown in FIG. 5) and the second air deflector 340.

The second and third fan ducts 370, 380 each have a gradually increased cross-sectional area from the fan 200 toward the heat sink 100. The outlets of the second and third fan ducts 370, 380 are respectively covers the upper portion of the heat sink 100 and an area below the bottom surface of the heat sink 100. Particularly, the inlet of the first fan duct 360 has an area larger than that of the inlets of the second and third fan ducts 370, 380.

Particularly referring to FIG. 5, the heat dissipation device 10 is installed on the printed circuit board 600. A CPU 700 located on the printed circuit board 600 is located in the first room and contacted by the heat sink 100, whereby heat generated by the CPU 700 can be absorbed by the heat sink 100. Heat originating from the CPU 700 is mainly absorbed by the base 122 of the heat sink 100, and is then upwardly conducting to the first fins 142 and the second fins 144. The heat accumulated at the heat sink 100 is then dissipated to ambient air under the help of the airflow produced by the fan 200. The airflow produced by the fan 200 is divided into three airstreams by the first, second and third fan ducts 360, 370, 380, and the three airstreams of the airflow are simultaneously flows towards different portions of the heat sink 100 along three different paths.

The first path is formed by the first fan duct 360. Since the area of the inlet of the first fan duct 360 is the largest in the three fan ducts 360, 370, 380, a large quantity of the airflow produced by the fan 200 is guided to flow into the first fan duct 360. The airflow flowing in the first fan duct 360 mainly flows past the first fins 142 and lower parts of the second fins 144 located in the lower portion of the heat sink 100, where has a higher temperature. Therefore, the heat of the lower portion of the heat sink 100 can be quickly dissipated.

The second path is provided by the second fan duct 370. Since the area of the inlet of the second fan duct 370 is smaller than that of the first fan duct 360, a relative small quantity of the airflow produced by the fan 200 is guided to flow into the second fan duct 370. The airflow flowing in the second fan duct 370 flows past upper parts of the second fins 144, and takes the heat at the upper parts of the second fins 144 away. As the upper parts of the second fins 144 have a relative low temperature, a relative smaller quantity of the airflow is required to dissipate the heat.

The third path is formed by the third fan duct 380. The area of the inlet of the third fan duct 380 is the smallest in the three fan ducts 360, 370, 380; a relative smaller quantity of the airflow produced by the fan 200 is guided to flow into the third fan duct 380. The airflow flowing in the third fan duct 380 flows past an area below the bottom surface of the heat sink 100, and flows past the CPU 700 and other electronic components therearound to directly dissipate a part of the heat of the CPU 700 before the heat being conducted to the heat sink 100 and heat generated by the other electronic components.

Moreover, for enlarging the heat dissipating area of the heat dissipation device 10, the top wall 420 of the cover 400 can be soldered onto the second fins 144 of the heat sink 100 so that the second fins 144 and the top wall 420 of the cover 400 are thermally connected together. Part of the heat accumulated at the second fins 144 can be conducted to the cover 400 to be dissipated. Therefore, the heat is dissipated not only by the fins 140 but also by the cover 400. Accordingly, the heat dissipating efficiency of the heat dissipation device 10 is enhanced.

As described above, the first air deflector 320, the second air deflector 340, the cover 400 and the printed circuit board 600 cooperatively define the three fan ducts 360, 370, 380, so as to guide the airflow flowing towards different portions of the heat sink 100, including the area below the bottom surface of the heat sink 100. In another preferred embodiment, the plate 344 of the second air deflector 340 may extend downwardly and outwardly to a bottom surface of the fan 200. As a result, the third fan duct 380 as described above is eliminated, and only the first fan duct 360 and the second fan duct 370 remain existent. In this situation, the second air deflector 340 and the cover 400 cooperatively ensure that the airflow from the fan 200 wholly enters the heat sink 100.

Figure 6:
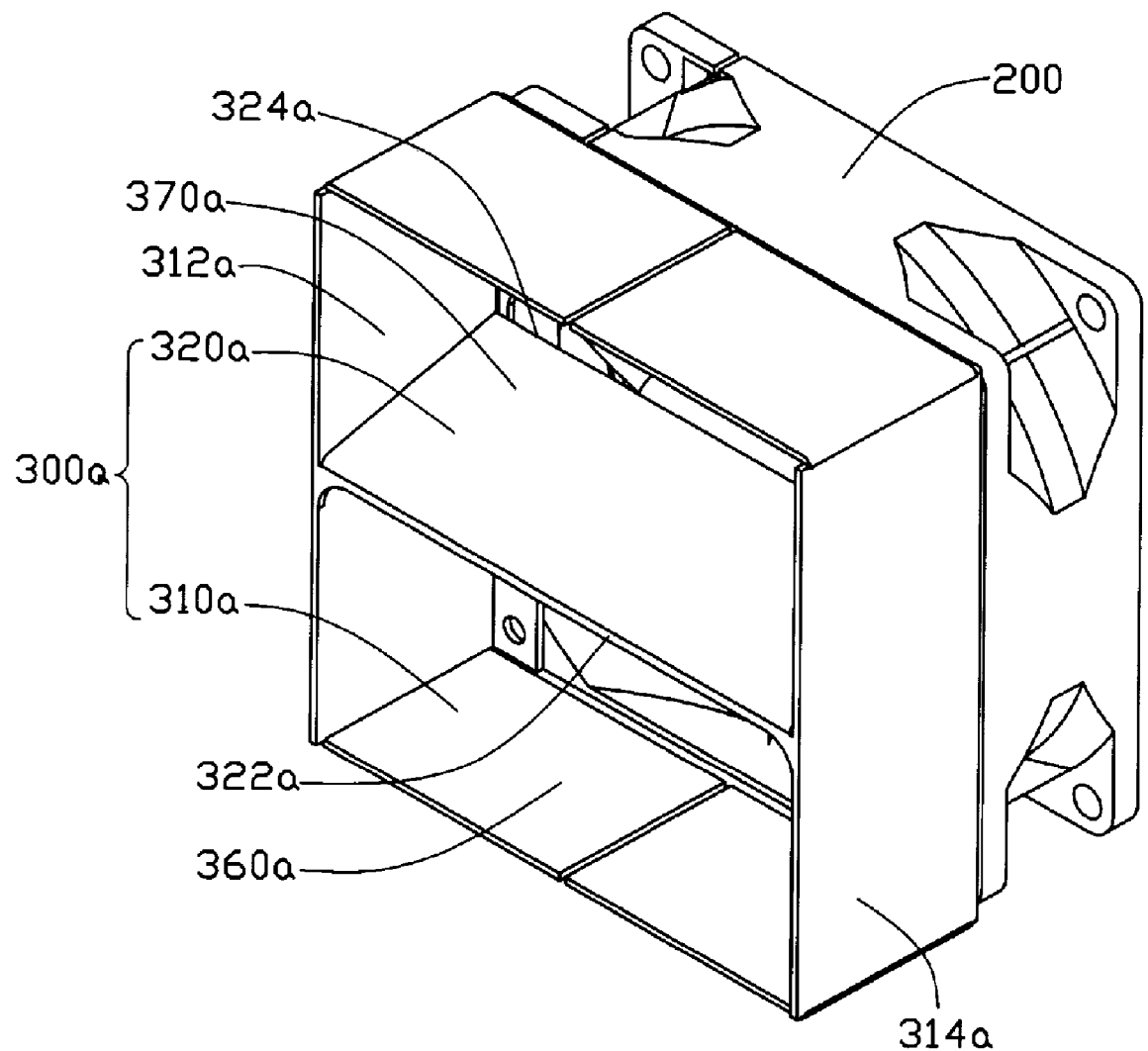
FIG. 6 is an assembled view of a fan and an air-guiding member of a heat dissipation device in accordance with another preferred embodiment of the present invention.
Figure 7:
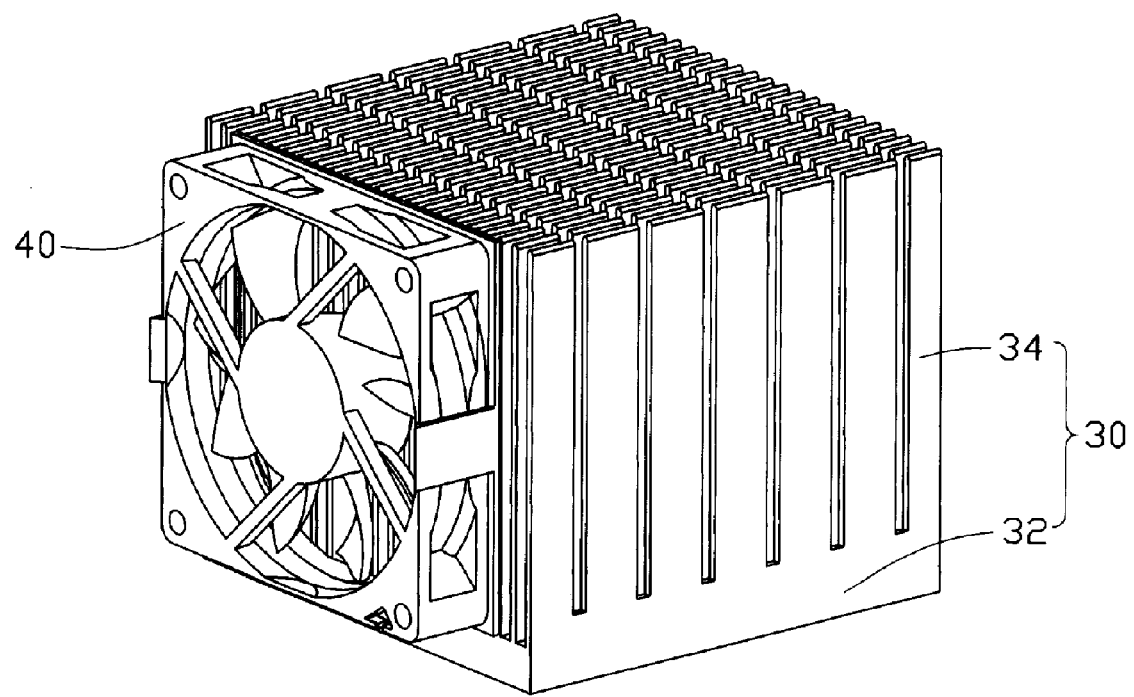
FIG. 7 is an isometric view of a heat dissipation device in accordance with related art.

FIG. 6 shows an air-guiding member 300a of a heat dissipation device in accordance with an another preferred embodiment of the present invention. The air-guiding member 300a comprises a rectangular tube 310a and an air deflector 320a positioned in the tube 310a. The rectangular tube 310a and the air deflector 320a are integrally formed as a single piece by, for example, plastics injection molding. The air deflector 320a is a plate member extending from a left sidewall 312a of the tube 310a to a right sidewall 314a of the tube 310a. The air deflector 320a is upwardly slanted from a front edge 322a of the air deflector 320a to a rear edge 324a of the air deflector 320a. As a result, the tube 310a is divided into a first fan duct 360a in a lower portion of the tube 310a and a second fan duct 370a in an upper portion of the tube 310a and above the first fan duct 360a. In assembly, the rear edge 324a of the air deflector 320a is positioned adjacent to the fan 220, while the front edge 322a is positioned adjacent to the heat sink 100.

The first fan duct 360a has a cross-sectional area which is gradually decreased from the rear edge 324a toward the front edge 322a. The second fan duct 370a has a gradually increased cross-sectional area along that direction. The inlet of the second fan duct 370a is adjacent to the fan 200 and has an area smaller than that of the inlet of the first fan duct 360a. As a result, more airflow flowing into the first fan duct 360a, and then flowing past the lower portion of the heat sink.

As described above, the airflow produced by the fan 200 is distributed over the heat sink 100 according to the temperature distribution over the heat sink 100 via the fan ducts. Particularly, the first fan duct 360 (360a) has a larger cross-sectional area covering the fan 200; thus, a large quantity of the airflow produced by the fan 200 can be guided to flow past the hottest portion of the heat sink. This serves to make good use of the airflow produced by the fan 200 to dissipate heat, and the efficiency of the heat dissipation device is increased by sufficient use of the airflow produced by the fan 200.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a heat sink;
a fan producing an airflow flowing towards the heat sink;
a cover enclosing the fan and the heat sink; and
an air-guiding member positioned between the fan and the heat sink, the air-guiding member comprising an air deflector dividing the airflow produced by the fan into airstreams and guiding the airstreams of the airflow flowing towards different portions of the heat sink;
wherein the air deflector comprises a plate slantways positioned between the heat sink and the fan; and
wherein the air-guiding member further comprises another air deflector positioned between the fan and the heat sink, the another air deflector comprising a plate spaced from the plate of the air deflector to form a first fan duct therebetween, the first fan duct having an inlet coupled to the fan and an outlet covering a portion of the heat sink having a higher temperature, the inlet having an area larger than that of the outlet and smaller than that of the fan.

2. The heat dissipation device as claimed in claim 1, wherein the air deflector and the cover cooperatively define a second fan duct adjacent to and above the first fan duct.

3. The heat dissipation device as claimed in claim 2, wherein the first fan duct has a cross-sectional area which is gradually decreased from the fan to the heat sink, and the second fan duct has a cross-sectional area which is gradually increased from the fan to the heat sink.

4. The heat dissipation device as claimed in claim 1, wherein the air deflector comprises two arms extending from an edge of the plate thereof for mounting the air deflector to the heat sink, and the another air deflector comprises two arms extending from an edge of the plate thereof for mounting the another air deflector to the heat sink.

5. The heat dissipation device as claimed in claim 4, wherein the heat sink comprises a base with two wings extending away from a portion of the base to two lateral side portions of the heat sink, and the arms of the air deflector and the arms of the another air deflector are secured at the wings of the heat sink.

6. The heat dissipation device as claimed in claim 1, wherein the air-guiding member comprises a tube, the air deflector being slantways positioned in the tube to divide the tube into a first fan duct and a second fan duct different form the first fan duct.

7. The heat dissipation device as claimed in claim 6, wherein the first fan duct has a cross-sectional area which is gradually decreased from the fan to the heat sink, while the second fan duct which is located above the first fan duct has a cross-sectional area gradually increased from the fan to the heat sink.

8. An heat dissipation device assembly, comprising:
a heat sink having a bottom surface adopted for contacting an electronic component supported on a printed circuit board;
a fan located at a lateral side of the heat sink; an air-guiding member comprising a first fan duct extending between the fan and the heat sink, the first fan duct having an inlet adjacent to the fan and an outlet covering a lower portion of the heat sink, the inlet of the first fan duct having an area smaller than that of the fan and larger than that of the outlet.

9. The heat dissipation device assembly as claimed in claim 8, wherein the first fan duct is a fan duct converging from the fan to the heat sink.

10. The heat dissipation device assembly as claimed in claim 8, wherein the air-guiding member comprises a first air deflector and a second air deflector extending away from the first air deflector to form the first fan duct.

11. The heat dissipation device assembly as claimed in claim 10, further comprising a cover enclosing the heat sink, the air-guiding member and the fan therein, and wherein the cover and the first air deflector cooperatively define a second fan duct above the first fan duct, the second fan duct having an outlet covering an upper portion of the heat sink.

12. The heat dissipation device assembly as claimed in claim 11, wherein the second fan duct is a fan duct diverging from the fan to the heat sink.

13. The heat dissipation device assembly as claimed in claim 11, wherein the second air deflector and the printed circuit board cooperatively define a third fan duct under the first fan duct for guiding a part of the airflow produced by the fan to flow past the bottom surface of the heat sink.

14. The heat dissipation device assembly as claimed in claim 8, wherein the air-guiding member comprises a rectangular tube, the air deflector being slantways positioned in the tube to divide the tube into a first fan duct and a second fan duct above the first fan duct, the first fan duct having a cross-sectional area gradually decreased from the fan to the heat sink, and the second fan duct having a cross-sectional area gradually increased from the fan to the heat sink.

15. A heat dissipation device comprising:
a heat sink comprising a base for contacting with an electronic device and a plurality of fins extending upwardly from the base;
a fan for generating an airflow flowing through the heat sink; and an air guiding member located between the heat sink and the fan for guiding the airflow from the fan to the heat sink, wherein the air guiding member has at least an air deflector, the at least air deflector dividing the airflow into at least two airstreams, one of the airstreams which is guided to flow to a lower part of the fins adjacent the base having a larger part of the airflow than another one of the at least two airstreams.

16. The heat dissipation device as claimed in claim 15 further comprising a cover enclosing the heat sink, the air guiding member and the fan therein, the another one of the at least two airstreams flowing between the at least an air deflector and the cover.

17. The heat dissipation device as claimed in claim 15, wherein the air guiding member is in a form of a tube and the at least an air deflector is located in the tube and integrally formed with the tube as a single piece.

* * * * *